United States Patent [19]

Shannon

[11] Patent Number: 5,715,026
[45] Date of Patent: Feb. 3, 1998

[54] METHOD OF FABRICATING ACTIVE MATRIX DISPLAY DEVICES WITH PREFABRICATED DISCRETE NON-LINEAR DEVICES

[75] Inventor: John M. Shannon, Whyteleafe, England

[73] Assignee: U.S. Philips Corporation, New York, N.Y.

[21] Appl. No.: 483,915

[22] Filed: Jun. 7, 1995

Related U.S. Application Data

[63] Continuation of Ser. No. 575,112, Aug. 30, 1990, abandoned.

[30] Foreign Application Priority Data

Sep. 15, 1989 [GB] United Kingdom ............ 8920963

[51] Int. Cl.⁶ ....................... G02F 1/136; G02F 1/1333
[52] U.S. Cl. ....................... 349/49; 349/50; 349/51; 349/86; 349/187
[58] Field of Search ....................... 350/333, 334, 350/336, 339 R; 340/784; 430/20; 445/24; 359/58, 54, 59, 60, 62; 345/91, 93; 437/51

[56] References Cited

U.S. PATENT DOCUMENTS

| 3,877,790 | 4/1975 | Robinson | 350/344 |
|---|---|---|---|
| 4,223,308 | 9/1980 | Baraff et al. | 350/334 |
| 4,413,883 | 11/1983 | Baraff et al. | 350/334 |
| 4,688,900 | 8/1987 | Doane et al. | 350/348 |
| 4,904,057 | 2/1990 | Sakayori et al. | 350/333 |

FOREIGN PATENT DOCUMENTS

| 0184341 | 6/1986 | European Pat. Off. | 350/333 |
|---|---|---|---|
| 2203881 | 10/1988 | United Kingdom | 350/332 |

*Primary Examiner*—William L. Sikes
*Assistant Examiner*—Tai V. Duong
*Attorney, Agent, or Firm*—Robert J. Kraus

[57] ABSTRACT

A method of fabricating an active matrix display device having a matrix of display elements (12), particularly liquid crystal elements. An array of first electrodes (24) are connected to associated address conductors (20) through two-terminal non-linear devices (16), in which the first electrodes and address conductors are provided as separate planar arrays. Prefabricated, physically discrete non-linear devices (35), such as MIMs or punch through diodes, are arranged between the planar arrays electrically coupling respective first electrodes to associated address conductors. A set of display element second electrodes/address conductors (18) is provided as a further array spaced from the array of first electrodes with liquid crystal material (21, 61) disposed therebetween. The non-linear devices are distributed, possibly carried in a polymer film, in a quasi-random manner. Large area displays are possible without using extensive lithography.

29 Claims, 4 Drawing Sheets

METHOD OF FABRICATING ACTIVE MATRIX DISPLAY DEVICES WITH PREFABRICATED DISCRETE NON-LINEAR DEVICES

This is a continuation prior application Ser. No. 07/575,112, filed on Aug. 30, 1990 now abandoned.

BACKGROUND OF THE INVENTION

This invention relates to an active matrix display device of the kind comprising an array of display elements each of which is associated with at least one two-terminal non-linear device connected between an electrode of the display element and an address conductor. The invention also is concerned with methods of fabricating display devices of this kind.

Active matrix addressed liquid crystal display devices using two terminal non-linear devices as switching elements for the display elements are now well known. The non-linear devices may be, for example, in the form of diode rings, back to back diodes or MIM (Metal-Insulator-Metal) devices. In a typical construction of an LC display device, two insulative and transparent, for example glass, substrates are provided spaced apart and carry respective sets of electrodes which, together with an LC material between the substrates, define individual display elements in an X-Y array. The non-linear devices are provided on one of the substrates adjacent the electrode of their associated display element. Also provided on that substrate is a set of row address conductors to which drive voltages are applied in operation of the device. Non-linear devices associated with a row of display elements are connected electrically between the display element electrodes and a respective row conductor on the substrate.

In fabricating this display device, the display element electrodes, address conductors and non-linear devices are formed in a two dimensional array on the surface of one substrate by depositing a series of thin film layers on the substrate and defining these layers into required patterns using photolithographic process operations.

Although this technique is now generally accepted it suffers from certain drawbacks. The photolithographic processes necessary mean that the display devices are expensive to produce. There is a demand for display devices having increasingly larger area displays. Because of the extensive use of lithography entailed in this approach, the capital cost required is very high. Moreover, great care is necessary to ensure that the so-formed non-linear devices in particular are, as far as possible, free from defects and faults and that their interconnections with address conductors and display element electrodes are sufficiently reliable. A defective non-linear device producing for example a short circuit can lead to a fault in the operation of one or more display elements thus rendering the device unusable. High yields are therefore difficult to obtain, this being the case particularly with comparatively large area displays. Attempts have been made to minimise these kinds of problems by incorporating extra components to provide some fault tolerance or redundancy. However, this adds significantly to the cost of fabrication.

It is an object of the present invention to provide active matrix display devices which can be produced conveniently with large display areas and at relatively low cost.

It is another object of the present invention to provide a method of fabricating active matrix display devices using two-terminal non-linear devices which offers simplicity and reliability.

SUMMARY OF THE INVENTION

According to one aspect of the present invention I disclose a method of fabricating an active matrix display device having an array of display elements consisting of first and second spaced electrodes with electro-optical material therebetween, the first electrodes each being connected electrically to an associated address conductor through at least one two-terminal non-linear device. The method includes the step of forming the first electrodes in a two-dimensional array and is characterised by the steps of forming the address conductors separate from the array of first electrodes and providing the non-linear devices as prefabricated discrete devices, and by arranging the non-linear devices, address conductors and first electrodes with the non-linear devices between the array of first electrodes and the address conductors whereby each non-linear device is coupled electrically between a respective first electrode and an associated address conductor. In a structure formed using this method and in which the non-linear devices are of uniform thickness, the first electrodes and the address conductors are in respective planes spaced from one another, and the non-linear devices, connected electrically between the first electrodes and the address conductors, extend between these planes. The non-linear devices may then in effect serve also as spacers maintaining the address conductors and first electrodes at a fixed distance apart, as determined by the thickness of the non-linear devices. Electrically-inert spacing elements of equivalent thickness to the non-linear devices may be interspersed with the non-linear devices if required to provide a greater density of spacers.

The electrical circuit thus obtained, with the non-linear devices connected between address conductors and display element electrodes, is equivalent to that of a conventional display device using two-terminal non-linear devices. However, an important distinction is that the display element electrodes, address conductors and non-linear devices are not formed on a common support. The address conductors and first electrodes are formed as arrays separately from one another and moreover separate from the non-linear devices. The method enables large area display devices to be fabricated readily while avoiding the need for extensive lithography. Compared with conventional forms of display devices, the arrays are simpler to produce, and thus greater reliability can be expected. For example, the width of the address conductors can be considerably greater, corresponding for example to the dimension of the display elements in the same direction, so that the possibility of discontinuities is removed. Likewise, improvements in the reliability of the non-linear devices are possible by virtue of the fact that the non-linear devices are fabricated independently of the conductor and electrode arrays. Because the non-linear devices are fabricated separately from the other components, their fabrication process can be select and preferential and is not limited for example by the need for compatibility with the processes used to form the electrodes and address conductors. The ability to fabricate large area display devices is particularly advantageous. By using separately formed arrays and prefabricated non-linear devices the formality of conventional fabrication processes for the address conductor, display element electrodes and non-linear devices, involving the setting down on a common support complex regular patterns requiring photolithography, interconnections, etc., over large areas, is unnecessary. The method of the present invention enables less complicated processes to be adopted, which leads to lower costs and also higher yields as the kinds of problems commonly experienced with conventional fabrication techniques are to a large extent avoided.

According to another aspect of the present invention an active matrix display device having an array of display elements comprising first and second spaced electrodes with electro-optical material therebetween, the first electrodes being in a two dimensional array with each first electrode being connected electrically with an associated address conductor through at least one two-terminal non-linear device, is characterised in that the address conductors are spaced from the array of first electrodes and in that physically discrete non-linear devices are arranged between the first electrodes and the address conductors with each non-linear device being coupled electrically between a respective first electrode and an associated address conductor.

The two-terminal non-linear devices may comprise thin film diode structures, for example MIM or p-n-p devices having opposing flat surfaces which constitute respective terminals. The non-linear devices are preferably of substantially uniform thickness, this thickness being the distance between their two terminals. They can then conveniently serve as spacing elements.

In one example of a suitable non-linear device of the MIM type, the device comprises a three-layer structure with each layer being of substantially uniform thickness, the two outer layers being of conductive material, such as a metal, and the intermediate layer being of insulative material. The devices are fabricated in bulk using commonly-deposited layers. In a preferred method of fabrication, the three layer structure is built up on a support, the structure is then scribed, for example in a rectangular pattern, to define separate individual portions of the structure, each of which is to provide a MIM device, and thereafter the support is removed, for example by etching, to leave physically discrete MIM devices. Because they are fabricated from common layers, the devices have a high uniformity of layer thickness and exhibit substantially identical performance. The scribing may be completely or only partially through the layers. In the latter case the MIM devices may still be attached to one another after removal of the support. They may be divided then to provide physically separate MIMs using a suitable technique such as rolling. In a particular example of this method, a layer of tantalum is evaporated on a support of polyimide, for example Kapton (Trade Name), film support. The tantalum layer is then subjected to an anodisation process to form a layer of insulative tantalum pentoxide at the surface remote from the film support. A further layer of tantalum is then deposited, for example by evaporation, over the insulative layer and the resulting three-layer structure linearly scribed, in a regular array of rows and columns, completely therethrough. Subsequently, the polyimide film is etched away.

In another example of a suitable non-linear device of the diode type, the device comprises a punch-through diode having a p+ n p+ layer structure. A preferred method of fabricating devices of this type in bulk comprises an epitaxial process on a single crystal wafer, using CVD or MBE. For example on a n+ type wafer there are formed successively a p type layer, followed by a p+ type layer, an n type layer and a further p+ type layer in that order. The four-layer structure thus formed is scribed linearly, in a regular array of rows and columns, completely or partially therethrough following which the substrate wafer is etched away, this etching stopping at the p type layer boundary, to leave discrete diode structures whose overall thickness is determined by the constituent layer thicknesses and whose other dimensions are determined by the scribing process. Diode structures of highly uniform thickness and substantially equivalent performance are thus obtained.

If only partially scribed, the devices can be separated to leave physically discrete devices by any suitable means, such as rolling.

By way of example, the non-linear device may typically be around ten by twenty μm in size and have a thickness of between five and ten μm depending on the type of device and its fabrication process. It will be appreciated that with the diode structures described above, the opposing major surfaces constitute the two contact terminals.

The non-linear devices may be disposed over the first electrodes in a quasi-random manner. To this end, the non-linear devices, which in bulk can be considered to take the form of a powder, may be distributed over the array of first electrodes, or alternatively the address conductors, by spinning or otherwise so that the devices are substantially evenly scattered over the first electrodes, or address conductors, the amount of "powder" being such that the density of the quasi-random distribution results in at least one non-linear device being present on the surface of each individual first electrode in the array. The provision of more than one non-linear device on any particular first electrode is not detrimental as in the finished display device they merely operate in parallel with one another. Indeed, the provision of two, or more, devices on each first electrode might be regarded as preferable as a degree of redundancy is then obtained.

In the method of the invention, the non-linear devices may be distributed over the array of first electrodes and thereafter the array of address conductors may be disposed over the non-linear devices, or vice versa.

Alternatively, the non-linear devices may be provided in a carrier film of transparent, insulative material. The carrier film may be disposed as a pre-formed component between the array of first conductors and the address conductors.

It will be understood that unlike conventional display device constructions the arrangement of the array of first electrodes and the array of address conductors in respective, spaced planes, with address conductors overlapping respective associated first electrodes, means that the positioning of the non-linear devices is not critical. Moreover, for the same reason, the first electrodes can be extended in size compared with those of conventional display devices as the need for gaps to be provided between adjacent rows, or alternatively columns as the case may be, of first electrodes to accommodate address conductors is removed. For simplicity, the width of the address conductors, at least at the regions of the first electrodes, is preferably substantially the same as the dimension of the first electrodes in that direction. For example, in the case where the address conductors comprise row conductors, their width is substantially equal to the height of the first electrodes. The area of overlap between a display element's first electrode and its associated address conductor is thus maximised making distribution of the non-linear devices easier. The size of a non-linear device is small in relation to that of the first electrode (typically approximately 250 μm square) so that the effect on light transmission through a display element due to the presence of one, or a few, non-linear devices, assuming the devices are non-transmissive and the display device is operated in the transmissive mode, is negligible. The address conductors may be formed from a layer of transparent material such as ITO. In addition, the address conductors may include a further layer of metal, for example aluminium, which is narrow in comparison with the transparent material.

Fabrication of the display device further includes the provision of opposing display element second electrodes spaced from the first electrodes and of electro-optical material between these electrodes.

The invention is of particular interest in relation to display devices in which the electro-optical material comprises liquid crystal material, although it is envisaged that other electro-optical materials could be employed.

In one embodiment, using liquid crystal as the electro-optical material, the opposing display element second electrodes are carried on a second support together with a liquid crystal film overlying the opposing display element electrodes and the display element first electrodes which overlie the film. Self-supporting films containing liquid crystal material, for example encapsulated liquid crystal films, sometimes otherwise referred to as a polymer dispersed liquid crystal films, may be employed. Encapsulated liquid crystal films are now well known in the art and, briefly, comprise small droplets of liquid crystal material, typically of the nematic type in operation and having positive dielectric anisotropy, which are embedded or encapsulated in a solid, but flexible, polymer film. Examples of this kind of film and its operation in a display device to modulate light is described in EP-A-88126 and in the article by J. L. Ferguson entitled "Polymer Encapsulated Nematic Liquid Crystals for Display and Light Control Applications" published in SID 85 DIGEST at pages 68–69. Because encapsulated liquid crystal films are solid, in the sense that they are self-supporting, the display element electrodes provided on the surface of the film remote from the support, that is, the first electrodes, no separate support is necessary for these electrodes. Thus the exposed surfaces of the first electrodes may be used to contact the non-linear devices directly.

The use of an encapsulated liquid crystal film in this manner greatly facilitates fabrication of the display device. The liquid crystal film, with electrodes on opposing surfaces can be provided as a sub-assembly using standard technology for these kinds of films. The prefabricated non-linear devices can then be disposed on this sub-assembly, either by themselves or carried in an insulative carrier film as previously mentioned, followed by the support carrying the address conductors to complete the assembly. Another possibility, when the non-linear devices are provided in a carrier film, is that the array of first electrodes is formed on the carrier film.

Other films containing pockets or cells of liquid crystal material may be used.

The comparatively new type of liquid crystal material known as liquid crystal polymer may also be used in the form of a film. This material, like encapsulated liquid crystal film, is a solid, self-supporting, type of film and consequently does not need any internal spacing elements in order to maintain the electrodes on its opposing surfaces in predetermined spatial relationship.

Other, more conventional, liquid crystal materials in fluid phase may be used.

In another embodiment, therefore, being a modified form of the above embodiment, an intermediate support layer of insulative material may be provided between the supports carrying the address conductors and second electrodes respectively which serves to contain the liquid crystal material, the intermediate support layer carrying the display element first electrodes. The first electrodes may be provided on the layer's surface facing the liquid crystal material and an additional set of electrodes in registration with the first electrodes provided on its opposite side with which the non-linear devices are in contact. In one variant of this embodiment, sets of electrodes on opposing sides of the intermediate support layer are separated completely by the support layer.

The respective pairs of registered electrodes on the intermediate support layer form, in combination with the insulative material of that layer, capacitors whereby in this embodiment, the one or more non-linear devices associated with an individual display element are capacitively coupled to the display element.

In another variant of this embodiment the intermediate support layer is provided with at least one aperture at the location of each pair of registered electrodes through which the pair of electrodes are in contact with one another.

In another embodiment of a display device adapted for use with fluid phase liquid crystal material, the non-linear devices are carried in a carrier film of insulative material on whose surface the array of first electrodes is carried. The address conductors may be formed on the opposing surface of this film, or alternatively on a substrate against which the film is disposed, whereby the address conductors and first electrodes are connected electrically via the non-linear devices. As before, the display element second electrodes are formed on a further substrate with liquid crystal material being disposed between the opposing first and second electrodes, the spacing between the first and second electrodes being maintained by spacing elements in conventional manner.

In all of the above embodiments, the display element second electrodes may for convenience and simplicity comprise portions of the second set of address conductors. This second set of address conductors may comprise column or row address conductors in which case the first-mentioned set of address conductors adjacent the non-linear devices comprise row or column address conductors respectively.

BRIEF DESCRIPTION OF THE DRAWINGS

Embodiments of the active matrix display devices, particularly liquid crystal display devices, and their method of fabrication, in accordance with the present invention will now be described, by way of example, with reference to the accompanying drawings, in which.

DETAILED DESCRIPTION OF PREFERRED EMBODIMENTS

Figure 1:
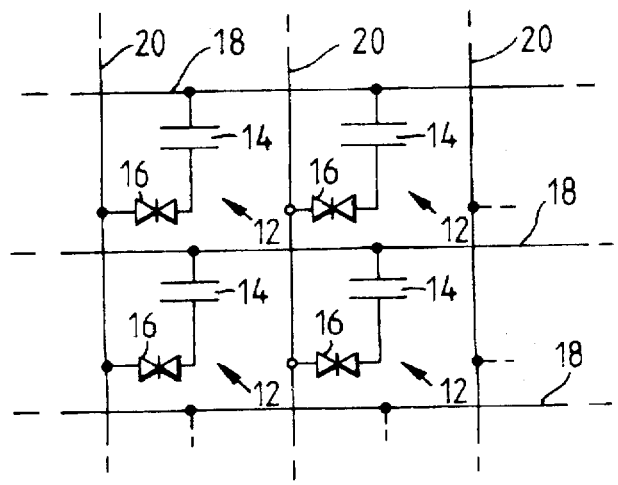
FIG. 1 shows schematically the circuit configuration of part of an active matrix liquid crystal display device according to the invention.
Figure 2:
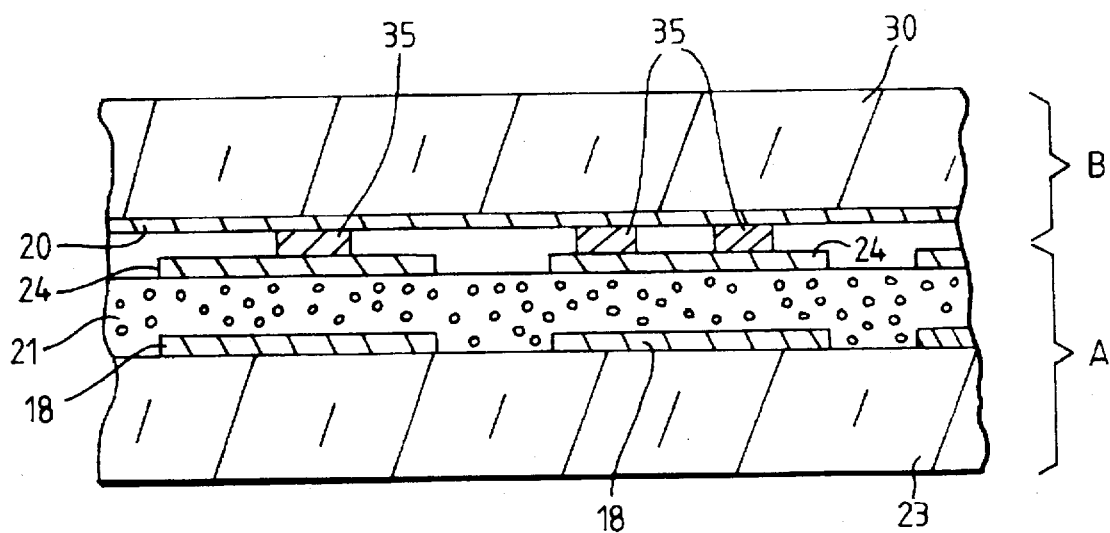
FIG. 2 is a schematic cross-sectional view, not to scale, through a typical part of one embodiment of a display device according to the invention.
Figure 3:
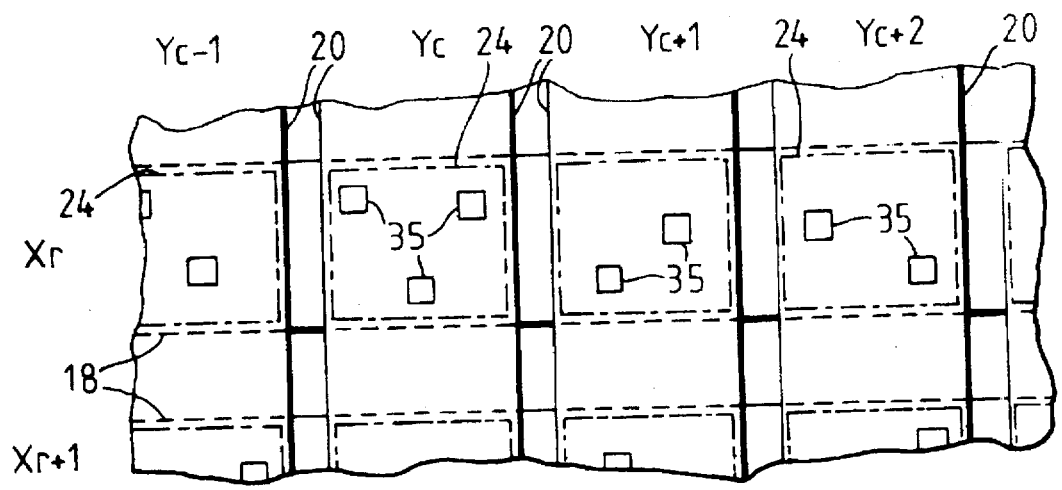
FIG. 3 is a schematic plan view, not to scale, of a part of the display device of FIG. 2.

Referring to FIGS. 1 to 3, the active matrix liquid crystal display device consists of m rows of picture elements 12 with n horizontal picture elements 12 in each row. The total number of picture elements in the matrix array of row and columns may be, for example, 200,000 or more. Only a few, typical, picture elements are represented in the figures for simplicity. Referring particularly to FIG. 1, each picture element 12 comprises a liquid crystal display element 14 connected electrically in series with a two-terminal bidirectional non-linear resistance element 16 exhibiting a threshold characteristic and acting as a switching element between a row address conductor 18 and a column address conductor 20 via which the picture element is addressed. Each element 16 may comprise one or more non-linear device. A single device is represented in FIG. 1. The sets of row and column address conductors extend at right angles to each other with the picture elements located at their cross-over regions.

The circuit of the picture elements thus far described and the manner in which they are driven follow conventional practice and as such will not be described herein in detail. Briefly, however, the row conductors 18 serve as scanning electrodes to which a scanning signal is applied sequentially in turn by a row driver circuit. In synchronism with the scanning signals data signals are applied to the column address conductors 20 by a column driver circuit to produce the required display from the display elements of each row as they are scanned. For a video or TV display these data signals comprise video information. By appropriate selection of the scanning and data signal voltages the optical transmissivity of the display elements 14 of each row of elements in turn are controlled to modulate light directed onto the display device to create a visible effect. Each row of display elements is addressed in one row address period in which the display elements are charged according to the value of the applied data signals, the display elements being isolated upon removal of the scanning signal so that the charge is stored in the display elements to maintain the display effect for the remainder of a field period until they are next addressed. The individual display effects of the rows of display elements combine to build up a complete picture in one field, the display elements being addressed again in subsequent field periods. For further information on the driving and operation generally of liquid crystal devices using two terminal non-linear switching elements reference is invited to U.S. Pat. No. 4,223,308 and GB-A-2091468 by way of example.

The structure of one embodiment of the display device is illustrated in FIGS. 2 and 3 which show respectively cross-sectional and plan schematic views of typical parts of the device. Referring particularly to FIG. 2, the display device can be regarded as having two sections, a display element section, A, and a switching section, B, each section including address conductors.

The display element section in this embodiment basically comprises a polymer dispersed liquid crystal type of matrix display. A transparent substrate 23, for example of glass or other rigid insulative material, has on its surface a set of parallel, transparent, ITO strip electrodes of constant width and uniform thickness which constitute row address conductors 18. These are provided in standard manner by deposition and definition of ITO material and extend in a flat plane. The conductors 18, and intervening surface areas of the substrate, are overlain with polymer dispersed liquid crystal film material 21 consisting of a solid polymer matrix in which separate, generally spherical, droplets 22 of nematic liquid crystal are dispersed, and whose surface remote from the substrate extends substantially parallel to the surface of the substrate. On the surface of the film 21 there are formed in conventional manner transparent display element electrodes 24 of ITO in a two dimensional regular array whose plane is parallel to that of the row conductors 18 and is spaced therefrom by the thickness of the film 21. The electrodes 24 are physically separate from one another and in the form of discrete rectangular pads supported by the film 21 in registration with the row conductors 18 and whose one dimension corresponds substantially with the lateral dimension of the row conductors, as can be seen in FIG. 3. The portions of the row conductors 18 underlying the electrodes 24 serve as second electrodes for the display elements. Each electrode 24 together with the underlying portion of its associated row conductor 18 and the film 21 therebetween constitutes a display element.

The structure of the display element section A follows that of conventional polymer dispersed liquid crystal display devices as described in the aforementioned references except that the display element electrodes 24 are individually defined rather than comprising respective portions of column conductors.

The size of each display element 14 is determined in accordance with the size of the overall display area and the desired resolution. For video, e.g. TV, display purposes they may typically be around 250 μm square. In known polymer dispersed liquid crystal films, the droplets 22 of liquid crystal can be from 1 to 20 μm in diameter and their size is chosen to suit the display element dimensions. The thickness of the polymer matrix material may be from around 2 to 50 μm so that several layers of droplets can be accommodated. Latex, polyvinyl alcohol, epoxy resin, polyurethane resin, polycarbonate resin or polyvinyl butyral resin can be used for the polymer. The liquid crystal droplets may be formed and fixed in random disbursement in the polymer matrix by chemical, thermal or light induced phase separation. The film 21 for example can be one of the encapsulated group in which the liquid crystal is encapsulated in polymer shells which are subsequently embedded in a polymer continuum or of the kind in which liquid crystal droplets are spontaneously dispersed in the matrix material during film formation.

The device, as shown in FIG. 2, includes a further substrate 30, again, for example, of glass, extending over the array of electrodes 24. The substrate 30 carries a set of constant width, uniform thickness, ITO strip electrodes constituting the column conductors 20 which extend at right angles to the row conductors 18 and which lie in a plane parallel to, and spaced from, the plane of the electrodes 24. The width of the column conductors 20 corresponds substantially with the dimension of the electrodes 24 in the same direction.

Disposed between the substrate 30 and the film 21, and bridging the space between the column conductors 20 and the display element electrodes 24 are discrete two-terminal non-linear devices 35, here shown in simple block form. In this embodiment the devices 35 comprise MIMs or punch-through diodes. The devices 35 are pre-formed and of rectangular shape with opposing, substantially flat, major surfaces. They are of uniform thickness and act as spacer elements between the conductors 20 and electrodes 24. Their opposing major surfaces constitute respective terminals so that, in situ, the two terminals of each device are in electrical contact with a column conductor 20 and a display element electrode 24 respectively, thus forming the circuit configuration illustrated in FIG. 1. The devices 35 are distributed over the film 21 in quasi-random fashion but in sufficient density to ensure that at least one device is provided between each electrode 24 and its associated column conductor 20.

The remaining space between the substrate 30 and the film 21 may be a partial vacuum or filled with air or an inert gas.

It will be appreciated from the circuit configuration that operation of the device is similar to conventional forms of display devices using two-terminal non-linear devices. In use, light is directed towards the substrate 30. In the absence of an electric field across the display elements 14, the droplets are in the isotropic, non-aligned, state with their optic axes randomly orientated so that light entering a display element is scattered. In the presence of an electric field across the display elements produced by a voltage difference being applied to the row conductors 18 and the display element electrodes 24, the optic axes of the droplets become aligned with the field so that minimal scattering of light takes place and the display elements become transparent allowing light to pass therethrough with practically no change in direction. By varying the applied field, the degree of transmission can be varied correspondingly to provide grey scales. The necessary voltage on the electrode 24 of a display element to produce the desired display effect is supplied when the display element is addressed by scanning and data signal voltages provided on its associated row and column conductors 18 and 20 which, in combination, are sufficient to overcome the threshold of the device 35, or devices if more than one is present on the electrode 24, whereby a voltage depending on the data signal voltage is written onto the electrode 24. Because of the overlap between electrodes 24 and column conductors 20, a parasitic capacitance, Cp, is introduced. To minimise undesirable effects caused by this capacitance Cp, the relevant spacings between the electrodes 24 and the conductors 20 on the one hand and the conductors 18 on the other are chosen such that the capacitance of the display element, $C_{LC}$ is much greater than the parasitic capacitance Cp. To this end, the thickness of the film 21 is preferably chosen to be less than the thickness of the non-linear device 35. The non-linear devices 35 may exhibit some capacitance in operation but any such capacitance is likely to be much smaller than the capacitance of the display elements and consequently will have minimal effect.

Fabrication of the display device will now be described. Section A of the device, comprising components 23, 18, 21 and 24, is formed as a sub-assembly using techniques standard in the art for polymer dispersed liquid crystal type display devices. Similarly, the substrate 30 and conductors 20 are provided as another sub-assembly using conventional processes in which ITO is deposited and patterned.

The prefabricated non-linear devices 35 are then distributed over the exposed surfaces of the electrodes 24 of the sub-assembly A. This is conveniently achieved by a spinning or sprinkling process, although other techniques may be used instead. The devices 35 are applied in the form of a "powder" which is produced in the following manner.

To obtain a powder of discrete bidirectional diode structure devices, for example MIM or pnp type devices, a large area, multiple layer diode structure is built up on a temporary support and then divided to produce physically discrete devices. Separation from the temporary support is accomplished by etching away the support. Division is assisted by scribing at least partially through the multiple layer structure while still supported to define individual portions of the structure. Upon subsequent removal of the support, the multiple layer structure is broken up into its individual elements, as determined by the scribing pattern, each of which constitutes a non-linear device.

Figure 4:
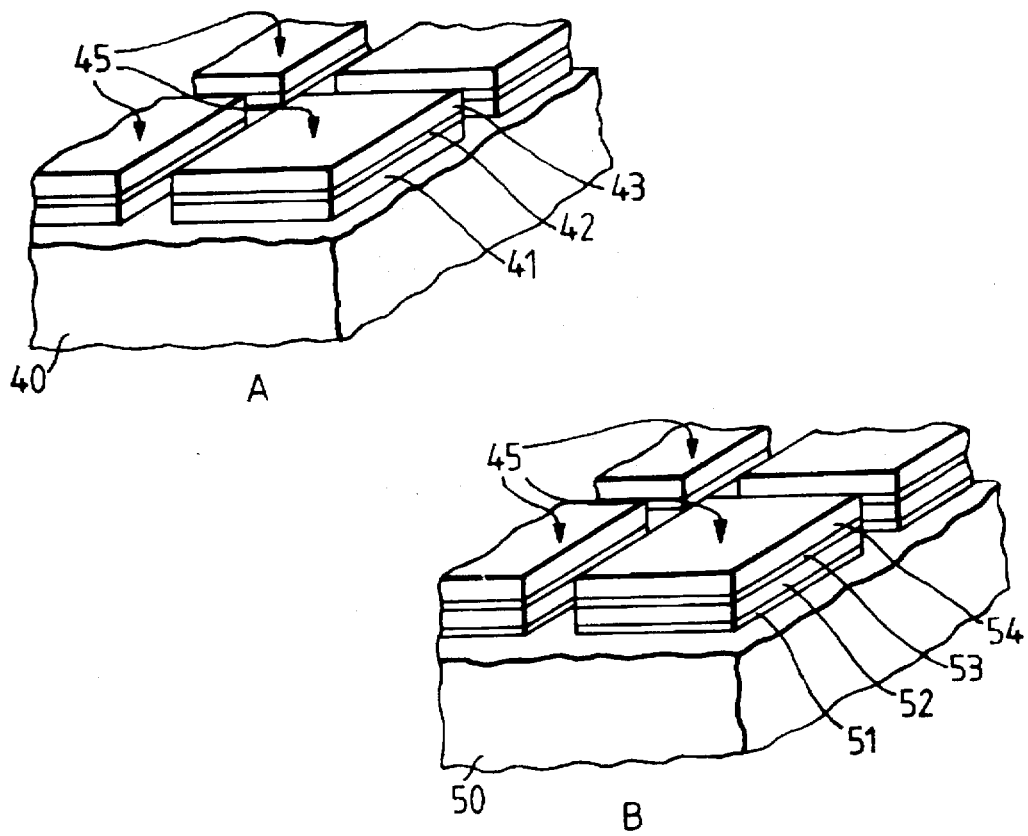
FIGS. 4A and 4B illustrate two forms of non-linear devices which are used in the display devices of the present invention during a stage in their fabrication.

Using this technique, and referring to FIG. 4A, MIMs having a known kind of structure comprising tantalum - tantalum pentoxide - tantalum superimposed layers are produced on a polyimide (e.g. Kapton) support film 40. Firstly, a layer of tantalum 41 of approximately 2.5 μm thickness is evaporated onto the film 40. This layer is then subjected to an anodisation process, using for example a weak citric acid solution, at an anodising voltage of around 30 to 60 V to produce a thin surface film of insulative tantalum pentoxide 42 around 0.1 μm in thickness. Following this, a further layer 43 of tantalum is evaporated over the surface of the tantalum pentoxide layer to a thickness of approximately 2.5 μm. All three layers are formed as continuous co-extensive layers.

The triple layer structure thus formed on the support film is then reticulated by scribing linearly, in a pattern of rows and columns, to define individual portions 45 of approximately 10 μm by 20 μm. This scribing may be completely or only part way through the three layers. FIG. 4A illustrates schematically, and not to scale, a small, representative, part of the structure following such scribing, which in this case is carried out to a depth approximately equal to the thickness of the three layers. In practice, the size of the film 40 and the area of the layers 40 to 43 is such that many hundreds of thousands of these individual portions 45 are defined. The polyimide support film 40 is then removed by means of a dry etching process or wet etching in hydrazine. Upon removal of this film the individual portions 45 of the structure become separated into physically discrete elements, each of which constitutes a MIM device 35. If only partial scribing is employed, the elements may still be joined after removal of the support film. If this is the case they can be physically separated by subjecting the triple-layer structure to rolling, or another suitable known technique, which breaks up the structure into the required individual elements.

In this way discrete rectangular MIM devices comprising a thin film of tantalum pentoxide sandwiched between tantalum layers are formed whose overall thickness is approximately 5 μm. The two opposing, flat, major surfaces of the elements, defined by the tantalum layers, act as respective terminals of the devices.

MIM devices using different materials known in the art can be produced instead using this method. Other examples of metallisation are aluminium, chromium, nickel or titanium. Insulative layer materials include aluminium oxide, silicon nitride, and silicon oxynitride.

Punch-through diodes having a p+ n p+ type diode structure of silicon material can also be formed in a similar manner. In a preferred method of making such devices a wafer of n+ single crystal silicon is used for the temporary support. Referring to FIG. 4B, successive continuous layers of uniform thickness are grown on the wafer, 50 by an epitaxial process, using either CVD or MBE. These directly superimposed layers comprise, in order starting at the wafer surface, a 0.1μm lightly doped p type silicon layer 51, a 4μm p+ type silicon layer 52, a 2μm n type silicon layer 53 and a 4μm p+ type silicon layer 54. The multiple layer structure on the wafer is then reticulated by linearly scribing in a pattern of rows and columns either completely or partly through the structure to define individual portions 45 of the structure approximately 20μm by 40μm in dimension. Like FIG. 4A, FIG. 4B illustrates schematically and not to scale a representative small part of the multilayer structure following the scribing operation, which in this case again is to a depth approximately equal to the thickness of the layers. As with the MIM structure, many hundreds of thousands of these portions 45 are produced. The n+ wafer is then removed by an etching process using 0.5% HF in $HNO_3$. The p type layer 51 acts as an etch stop so that etching finishes at the p type layer boundary. Upon removal of the wafer, the individual portions 45 of the multiple layer structure defined by scribing are separated into physically discrete elements, each of which constitutes a punch through diode device. Again, it may be necessary if only partial scribing is used to physically separate any elements still joined together by a rolling operation or similar to break them into the required individual elements. The layer 51 may be removed by a non-selective silicon etch. Because of its thinness, however, it adds little resistance and its presence should not affect operation of the diode structure adversely.

The individual diodes thus formed each comprise a rectangular multi-layer structure of around 20μm by 40μm and of a uniform thickness of approximately 10μm. The opposing two major, flat, surfaces constitute the terminals of the device.

Flat-surfaced, two terminal non-linear devices having p–i–p, n–i–n, or n–p–n structures may similarly be formed using this method.

The shape of the non-linear devices 35, comprising a slab having two opposing flat major surfaces, ensures that when they are deposited over the electrodes 34 they lie in the desired orientation with their major surfaces extending parallel with the planes of the first electrodes 24 and the address conductors 20. Because of the symmetrical and bidirectional characteristic electrical behaviour of the device 35 in operation it is not important which way up they fall. If two, or more non-linear devices 35 are associated with any one electrode 24, they operate in parallel with one another so that a degree of redundancy is afforded.

The electrodes 24 are preferably spaced such that the gap between adjacent electrodes 24 is greater than the maximum dimension of a non-linear device so that bridging of two adjacent electrodes 24 by a non-linear device when randomly scattered is not possible. However, even if the spacing of electrodes 24 is reduced such that a non-linear device could perhaps be located with its one terminal bridging across two adjacent electrodes the effects on the display device produced would hardly be perceptible.

In a variant of the above-described method, the non-linear devices 35 may instead be scattered over the address conductors 20 on the substrate 30 and the section A then disposed over the exposed surfaces of the non-linear devices.

After the two substrates 20 and 30 are brought together, they are clamped together around their periphery under pressure which ensures that the non-linear devices 35 are held firmly between their associated electrodes 24 and conductors 20 and that reliable electrical contact is achieved. The remaining space between the substrate 30 and the film 21 may be filled with air or an inert gas. Preferably, however, this space is subjected to a partial vacuum whose effect would be to assist in firmly clamping the devices 35.

Because the non-linear devices are formed separately and disposed as prefabricated devices between pre-formed electrodes, the need for complex photolithographic processes to define display elements electrodes and address conductors together with non-linear devices on a common substrate is avoided. The two sub-assemblies used in fabricating the display device, comprising section A and the substrate 30 with column conductors 20 respectively, are simple to form using standard technology which does not require complicated photolithography processes and conductor interconnections over large areas. These components can therefore be fabricated with greater reliability. Likewise, the manner in which the non-linear devices are formed offers greater reliability. The method of fabricating display devices according to the invention avoids the formality of existing approaches and is a major simplification of conventional technologies. High yields of display devices can be expected and at comparatively low cost. Importantly, the display device construction means that devices with large display areas can be produced in a convenient and relatively simple manner.

Various modifications to the above described embodiment of display device and its method of fabrication are possible within the scope of the invention. For example, the described arrangement of row and column address conductors may be reversed with the non-linear devices contacting row conductors provided on the substrate 30 and column conductors provided on the substrate 23.

Further, the non-linear devices 35 may be contained, or embedded in, a film of transparent insulative polymer material, for example polyimide or polyurethane provided in the space between the electrodes 24 and the conductors 20 rather than this space being partially occupied by only the non-linear devices themselves. The insulative material matrix may be provided in situ after the devices 35 have been scattered over the electrodes 24, or the conductors 20, by depositing the material in a non-solid state over the electrodes 24 or conductors 20 as the case may be such that it flows around the devices 35 and fills the spaces therebetween to a thickness slightly less than the thickness of the devices 35. Thereafter, the material is allowed to set or harden or is suitably cured or treated according to the type of material employed to form a solid matrix thereby trapping and physically restraining the devices. Preferably, however, a film of the combined insulative material and non-linear devices is formed as a separate component and then subsequently disposed over the electrodes 24 or conductors 20, thus eliminating the step of disposing the devices over, for example, the electrodes 24 by scattering. Such a film can be obtained by scattering the devices over a support and depositing the insulative material in a manner similar to that described previously in which the density of the devices is sufficient to ensure that ultimately at least one device is associated with each display element, and thereafter removing the film from this support. The film, with the devices contained and supported by the matrix material, is then laid over the electrodes 24 or conductors 20. Alternatively, the insulative material can be deposited over the support and thereafter the devices scattered over this material and embedded in the material by pressing the devices into the material with the aid of a movable plate. After embedding the devices, the film is removed and can then be used as before.

It is intended that the major surfaces of the embedded devices, that is their terminals, remain exposed so that in use of the film direct contact is established between these terminals surfaces and the electrodes 24 and conductors 20. Using these methods, the possibility exists that a thin layer of polymer material may overlie a terminal surface. When the film is disposed between the electrodes 24 and the conductors 20, however, electrical coupling between this terminal and its associated electrode 24 or conductor 20 is achieved capacitively rather than by direct contact and operation of the display element concerned would normally be unimpaired. Thus with regard to FIG. 1, the effective circuit in this case would include a capacitor in series with the non-linear device 16 between the display element 14 and its address conductor 20.

Figure 5:
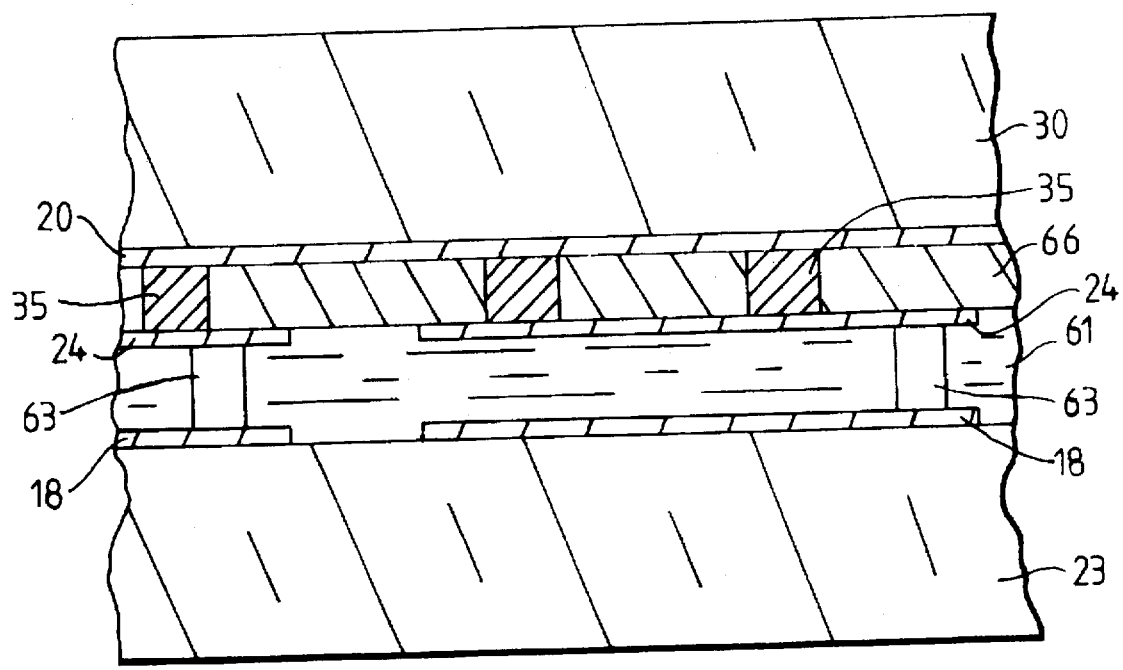
FIGS. 5, 6 and 7 are schematic cross-sectional views, not to scale, through parts of three further embodiments of display devices according to the invention.
Figure 6:
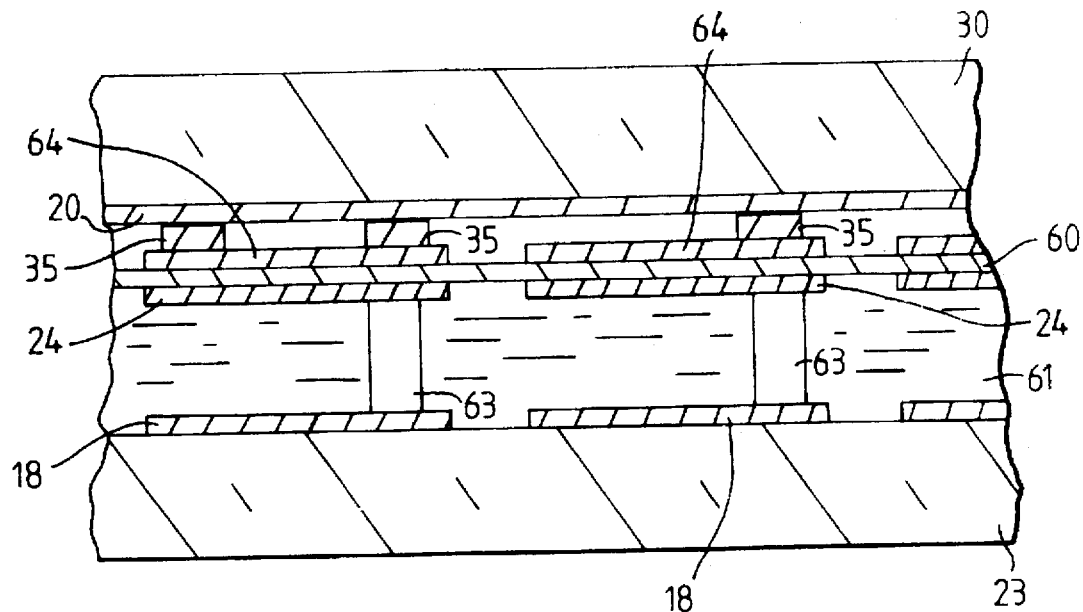
Figure 7:
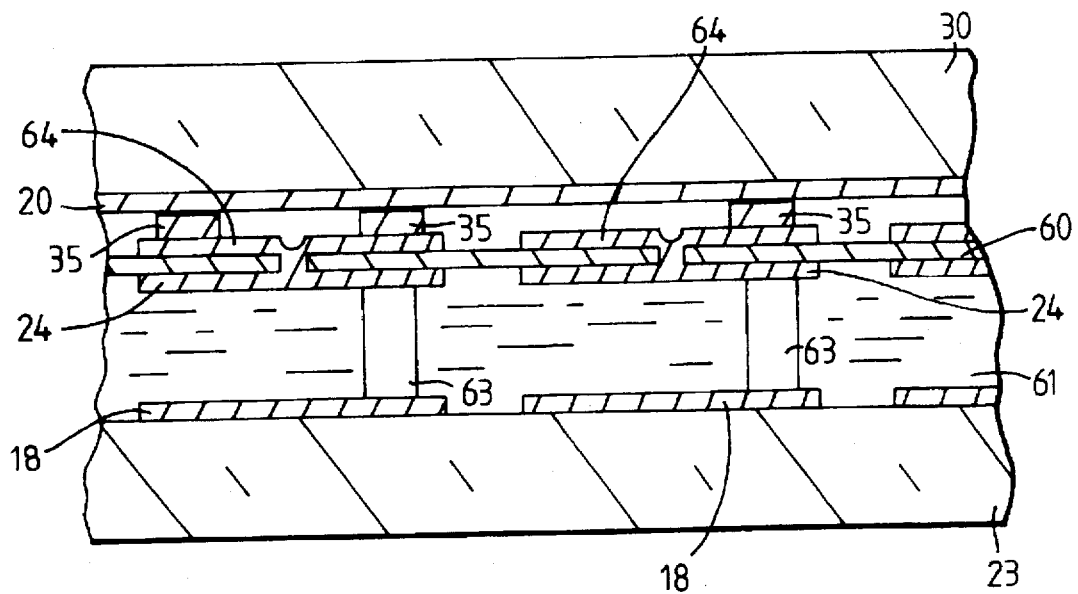

The display elements may comprise fluid liquid crystal material rather than solid polymer dispersed or similar type material. FIGS. 5, 6 and 7 show schematic cross-sections through three embodiments of liquid crystal display devices of this kind. In these Figures, the same reference numerals are used to designate components corresponding to those of the previous embodiment.

Referring to FIG. 5, this embodiment is similar in many respects to the variant of the previous embodiment using a carrier film of polymer material such as a polyimide in which the non-linear devices are contained. The carrier film, here referenced at 66, containing the device 35 embedded therein may be prefabricated as a separate component using the methods described previously. In this embodiment the carrier film also carries the display element electrodes 24 which are formed by depositing and patterning ITO material on the surface of the film. The conductors 20 may be formed on the other surface of the film 66 a similar manner or instead formed on the substrate 30 with the film then being disposed adjacent the conductors. Alternatively, the conductors 20 may be formed on the substrate 30, and the non-linear devices 35 then scattered over the conductors 20 following which the polymer material constituting the film is deposited to fill the spaces between the devices 35 and form the film in situ as also previously described. Thereafter, the electrodes 24 are formed on the surface of the film 66.

Using any of these methods, a sub-assembly comprising the components 30, 20, 35, 66 and 24 is obtained.

This sub-assembly is then brought together with the sub-assembly comprising the substrate 23 and the conductors 18 with inert spacing elements 63 disposed therebetween to maintain the two sub-assemblies a predetermined distance apart. It will be understood therefore that in the resulting structure, the conductors 20 and 18 and the electrodes 24 lie in respective, spaced, planes which are substantially parallel to one another with each display element electrode 24 being electrically coupled with an associated conductor 20 via at least one non-linear device 35 as in the previous embodiment. The space between the film 66 and the substrate 23 is bounded by sealing means around the periphery of the structure and twisted nematic liquid crystal, 61, material is introduced so as to fill completely this space. In practice, the electrodes 24 and the conductors 18 would be covered by molecular alignment layers in conventional fashion, these layers having been omitted from FIG. 5 for simplicity.

Referring now to FIG. 6, this embodiment uses fluid twisted nematic liquid crystal 61 which is contained between the substrate 23 and a further, intermediate layer 60 of transparent insulative material extending continuously and completely over the display area. As before, row conductors 18 are carried on the substrate 23. The display element electrodes 24 are carried on the surface of the layer 60 facing the substrate 23. The substrate 23 and the intermediate layer 60 are maintained a predetermined distance apart in the usual manner by spacer elements 63 of inert material. For each electrode 24, a respective supplementary pad electrode 64 of ITO is provided on the surface of the layer 60 which is co-extensive with the electrode 24. In this embodiment, therefore, the non-linear devices 35 make contact with the supplementary electrodes 64 rather than directly connecting with the electrodes 24. Each respective pair of electrodes 24 and 64 together with the insulative material of the layer 60 therebetween act as a capacitor whose capacitance is determined by the thickness of the layer 60. Thus, for each display element in this arrangement, the associated one or more non-linear devices 35 are capacitively coupled to the display element electrode 24. The material for the layer 60 is chosen having regard also to its supporting function and the mechanical properties required in this respect. The insulative material of the layer 60 should be sufficiently stiff to prevent significant distortion in the plane thereof due to pressure applied to the layer 60 by the devices 35 and the spacer elements 63 upon clamping together of the substrates 20 and 30. In constructing this embodiment, first, second and third sub-assemblies, comprising respectively the substrate 23 and conductors 18, the layer 60 with the electrodes 64 and 24, and the substrate 30 with the conductors 20, are fabricated separately. The non-linear devices 35 are distributed over the conductors 20 and clamped thereagainst by positioning the second sub-assembly. In the third sub-assembly the spacer elements 63 serve to define a gap of predetermined thickness which is subsequently filled with liquid crystal material.

The embodiment of FIG. 7 can be regarded as a variant of the embodiment of FIG. 6. In this arrangement, the layer 60 is formed with a regular array of perforations each of which is at the location of the display element electrode 24. When the electrodes 24 and 64 are provided on opposing surfaces of the layer 60 therefore, the deposited electrode material extends through the perforations so that each pair of electrodes 24 and 64 are connected electrically. Thus the terminals of the non-linear devices 35 facing the display elements are connected electrically with their associated display element electrodes 24.

In all of the embodiments described with reference to FIGS. 5, 6 and 7 it will be appreciated that the same general advantages are afforded as described with regard to the embodiment of FIGS. 2 and 3. Notably the need for extensive and complex lithography, particularly when making large area display devices, is avoided.

It should be understood that the Figures are merely schematic and are not drawn to scale. In particular certain dimensions such as the thickness of the layers or regions may have been exaggerated while other dimensions may have been reduced. It should also be understood that the same reference numerals are used throughout the Figures to indicate the same or similar parts.

From reading the present disclosure, other modifications will be apparent to persons skilled in the art. Such modifications may involve other features which are already known in the field of active matrix display devices and component parts thereof and which may be used instead of or in addition to features already described herein.

I claim:

1. A method of fabricating an active matrix display device having an array of display elements including spaced-apart first and second electrodes with electro-optical material therebetween, the first electrodes each being connected electrically to an associated address conductor through at least one two-terminal non-linear device, the method comprising: the step of forming the first electrodes in a two-dimensional array, the steps of forming the address conductors separate from the array of first electrodes and providing the non-linear devices as prefabricated discrete devices, and arranging the prefabricated discrete non-linear devices, address conductors and first electrodes with the non-linear devices between the array of first electrodes and the address conductors in a manner such that each non-linear device is coupled electrically between a respective first electrode and an associated address conductor.

2. A method according to claim 1, further comprising the steps of forming the address conductors on an insulative support and thereafter disposing the support over the array of first electrodes with the non-linear devices positioned therebetween.

3. A method according to claim 2, further comprising the step of distributing the prefabricated discrete non-linear devices in a quasi-random manner over the first electrodes or the address conductors prior to disposing the address conductors over the first electrodes.

4. A method according to claim 3, further comprising the step of providing insulative material in the space between the address conductors and the first electrodes and around the non-linear devices.

5. A method according to claim 1, further comprising; prefabricating the non-linear devices as discrete non-linear devices carried in a discrete film of transparent insulative material.

6. A method according to claim 5, further comprising the step of forming the array of first electrodes on one surface of said film of insulative material.

7. A method according to claim 6, further comprising the steps of forming the address conductors on a support and thereafter disposing the film insulative carrying the non-linear devices over the address conductors.

8. A method according to claim 6, further comprising the step of forming the address conductors on the opposing surface of said film of insulative material.

9. A method according to claim 1, further comprising the further steps of forming on an insulative substrate an array of display element second electrodes, disposing the substrate over, and parallel to, the array of first electrodes with respective ones of the first and second electrodes facing and spaced from one another and providing liquid crystal material in space between the first and second electrodes.

10. A method according to claim 1, further comprising; preforming a self-supporting film containing liquid crystal material, and forming an array of the display element second electrodes and arranging the arrays of first and second electrodes parallel to and spaced from one another with the self-supporting film containing liquid crystal material situated between the two arrays.

11. A method according claim 1, further comprising, prefabricating the non-linear devices as thin film diode devices.

12. A method according to claim 11, further comprising the steps of fabricating the thin film diode devices by forming on a support a multiple layer structure comprising a series of layers of selected materials constituting a diode structure, scribing the multiple layer structure to define individual portions thereof, and thereafter removing the support and separating the portions into discrete elements each constituting a diode device.

13. A method of fabricating an active matrix display device comprising:
prefabricating a plurality of physically discrete non-linear devices,
forming a first sub-assembly comprising a first substrate with a first planar array of address conductors on the first substrate, a planar array of first electrodes spaced apart from and parallel to the first planar array of address conductors and with an electro-optical material located in a space formed between the first planar array of address conductors and the planar array of first electrodes,
forming a second sub-assembly comprising a second substrate with a second planar array of address conductors thereon, and
combining said first and second sub-assemblies together into said active matrix display device with the prefabricated physically discrete non-linear devices located between the second planar array of address conductors and the planar array of first electrodes in a manner such that each non-linear device is electrically coupled between a respective first electrode and an associated second address conductor.

14. A method according to claim 13 wherein the step of prefabricating the physically discrete non-linear devices comprises:
preparing a thin film of transparent insulative material with the non-linear devices supported thereon to form a separate component, and
positioning said separate component over the planar array of first electrodes or over the second planar array of address conductors prior to combining said first and second sub-assemblies.

15. A method according to claim 13 comprising, prior to combining said first and second sub-assemblies,
distributing the prefabricated physically discrete non-linear devices in a quasi-random manner over the second planar array of address conductors or over the planar array of first conductors with sufficient density such that at least one non-linear device is positioned between each first electrode and its associated second address conductor in the active matrix display device.

16. An active matrix display apparatus comprising an array of display elements comprising spaced-apart first and second electrodes with electro-optical material therebetween, the first electrodes being in a two dimensional array with each first electrode being connected electrically with an associated address conductor through at least one two-terminal non-linear device, wherein the address conductors are spaced from the array of first electrodes and in that physically discrete non-linear devices are arranged between the first electrodes and the address conductors with each non-linear device being coupled electrically between a respective first electrode and an associated address conductor, said non-linear devices being distributed between the first electrodes and the address conductors in a quasi-random manner such that each first electrode includes at least one non-linear device in contact therewith.

17. An active matrix display apparatus comprising an array of display elements comprising spaced-apart first and second electrodes with electro-optical material therebetween, the first electrodes being in a two-dimensional array with each first electrode being electrically coupled with an associated address conductor through at least one two-terminal switching device having a non-linear current-voltage characteristic, the address conductors lying in a plane spaced from the array of first electrodes, wherein said two-terminal switching devices are in the form of prefabricated loose-laid switching bodies arranged between the first electrodes and the address conductors in a quasi-random way.

18. An active matrix display apparatus having an array of display elements defined by numbers of spaced-apart first and second electrodes with electro-optical material disposed therebetween, said apparatus comprising:
a. an arrangement of address conductors for electrical connection to the first electrodes, said first electrodes and said address conductors having facing surfaces spaced apart by a predetermined dimension; and
b. a quantity of prefabricated physically-discrete, substantially-evenly distributed, non-linear devices disposed between the array of first electrodes and the arrangement of address conductors, each of said devices having opposing surfaces defining electrical terminals for contacting one of said first electrodes and one of said address conductors, respectively, and having a thickness corresponding to said predetermined dimension, said quantity sufficiently exceeding the number of said first electrodes such that each first electrode is electrically coupled to one of said address conductors through at least one of said devices.

19. An active matrix display apparatus as in claim 16 where the at least one non-linear device comprises a thin film diode having opposing flat surfaces forming respective terminals.

20. An active matrix display apparatus as in claim 17 where the two-terminal switching devices comprise thin film diodes, each having opposing flat surfaces forming respective terminals.

21. An active matrix display apparatus as in claim 18 where the non-linear devices comprise thin film diodes, each having opposing flat surfaces forming respective terminals.

22. An active matrix display apparatus as in claim 16, 17 or 18 where the address conductors are disposed on a transparent insulating support.

23. An active matrix display apparatus as in claim 16 where the at least one non-linear device comprises a plurality of said devices which are supported in a film of transparent insulating material extending between the address conductors and the first electrodes.

24. An active matrix display apparatus as in claim 17 where the two-terminal switching devices are supported in a film of transparent insulating material extending between the address conductors and the first electrodes.

25. An active matrix display apparatus as in claim 18 where the non-linear devices are supported in a film of transparent insulating material extending between the address conductors and the first electrodes.

26. An active matrix display apparatus as in claim 16 where the at least one non-linear device comprises a plurality of said devices serving as spacers between the address conductors and the first electrodes.

27. An active matrix display apparatus as in claim 17 where the two-terminal switching devices serve as spacers between the address conductors and the first electrodes.

28. An active matrix display apparatus as in claim 18 where the non-linear devices serve as spacers between the address conductors and the first electrodes.

29. An active matrix display apparatus as in claim 18 where the non-linear devices comprises two-terminal switching devices having a non-linear current-voltage characteristic.

* * * * *